United States Patent [19]

Komatsu et al.

[11] 4,405,915
[45] Sep. 20, 1983

[54] PHOTOELECTRIC TRANSDUCING ELEMENT

[75] Inventors: Toshiyuki Komatsu, Yokohama; Masaki Fukaya, Kawasaki; Shunichi Uzawa; Seishiro Yoshioka, both of Tokyo; Yoshiaki Shirato, Yokohama, all of Japan

[73] Assignee: Canon Kabushiki Kaisha, Tokyo, Japan

[21] Appl. No.: 246,218

[22] Filed: Mar. 23, 1981

[30] Foreign Application Priority Data

Mar. 28, 1980 [JP] Japan .................. 55-40064
Mar. 28, 1980 [JP] Japan .................. 55-40066
Mar. 28, 1980 [JP] Japan .................. 55-40067

[51] Int. Cl.$^3$ .................. H01L 31/08; H01L 27/14
[52] U.S. Cl. ...................... 338/15; 338/17; 338/19; 357/2; 357/30
[58] Field of Search ............ 338/13, 15, 17, 18, 338/19; 250/211 R; 357/2, 30, 59; 174/68.5

[56] References Cited

U.S. PATENT DOCUMENTS 4,064,521 12/1977 Carlson .................. 357/2

4,307,372 12/1981 Matsui .................. 338/15

FOREIGN PATENT DOCUMENTS

WO79/00776 10/1979 PCT Int'l Appl. ........ 357/59 A
2029642 3/1980 United Kingdom ...... 357/59 A Primary Examiner—B. A. Reynolds
Assistant Examiner—Teresa J. Walberg
Attorney, Agent, or Firm—Fitzpatrick, Cella, Harper & Scinto

[57] ABSTRACT

A photoelectric transducing element comprising (a) a substrate; (b) first electrode provided on said substrate; (c) first contact layer to form an ohmic contact with said first electrode with respect to electric charge in at least one polarity; (d) a photoconductive layer provided in contact with said first contact layer and composed of an amorphous material containing silicon atom as a matrix and hydrogen atom, or halogen atom, or both, at a ratio of 1 to 30 atomic % with respect to said silicon atom; (e) second contact layer provided in contact with said photoconductive layer; and (f) second electrode to form an ohmic contact with said second contact layer with respect to said charge.

33 Claims, 19 Drawing Figures

PHOTOELECTRIC TRANSDUCING ELEMENT

BACKGROUND OF THE INVENTION

1. Field of the Invention

This invention relates to a photoelectric transducing element for an image or visual information processing photoelectric converter to be adopted in facsimiles, character reading devices, and others.

2. Description of Prior Arts

Photoelectric transducers which have heretofore been used generally and are composed of a long array of one-dimensional photo-diodes formed on a crystalline silicon substrate accompany various disadvantages such that, due to restriction to a practical size of a single crystal of silicon to be the substrate and its processing technique, the length of the light receiving region in the photodiode is restricted, and its yielding rate is also low. Consequently, when an image original to be read has a width of 210 mm (corresponding to A-4 size), it has generally been the practice to focus the image original on the light receiving region of a photo-sensor array in a reduced scale by use of a lens system for the necessary reading. Such method of using the optical lens system not only makes it difficult to reduce the size of the photoelectric converter, but also necessitates a large quantity of light to obtain sufficient photo-signal current because of difficulty in allotting a large area for individual light receiving regions. As the result of this, the photoelectric transducer of this type is, at the present stage, used only for those purposes where the image original reading may be done at a slow pace, or where high image resolution is not required.

On the other hand, elongation in the photosensor array and enlargement in the area of the individual light receiving regions become feasible with the photoelectric transducing element fabricated by forming a photoconductive layer through lamination, on a predetermined substrate, of a thin or thick film which is coated by use of a film forming method using a vaccum deposition device employing the glow discharge method, the sputtering method, the ion-plating method, the vaccum evaporation method, etc., or a method of applying the photoconductive material in mixture with a binding resin.

In such photoelectric transducing element, however, there still remains room for improvement, such that the S/N ratio (photo-current/dark current) is small due to the dark current being relatively large, hence sufficient electrical signal cannot be taken out with respect to the light signal in a region where the light quantity is very small, the resolution is not so high due to cross-talk of signal current among the light receiving sections, and so forth. It is therefore necessary in this elongatable photoelectric transducing element to attempt an increase in the dark resistance of the photoconductive layer, remodelling of the structure of the element, decrease in the dark current, and improvement in the resolution.

SUMMARY OF THE INVENTION

It is the primary object of the present invention to provide an improved photoelectric transducing element for use in a general image information processing photoelectric transducer.

It is the secondary object of the present invention to provide a photoelectric transducing element and an array of such elements capable of preventing an increase in the dark current and interaction among electrical signals in the adjacent light receiving section, and having a high S/N ratio and excellent resolution.

It is another object of the present invention to provide a photoelectric transducing element and an array of such elements capable of taking out photo-signal current generated by an input photo-signal at a high efficiency, and of reading the signal at a high speed.

According to one aspect of the present invention, there is provided a photoelectric transducing element comprising (a) a substrate; (b) first electrode provided on said substrate; (c) first contact layer to form an ohmic contact with said first electrode with respect to electric charge in at least one polarity; (d) a photoconductive layer provided in contact with said first contact layer and composed of an amorphous material containing silicon as a matrix and hydrogen, or halogen, or both, at a ratio of 1 to 30 atomic % with respect to said silicon; (e) second contact layer provided in contact with said photoconductive layer; and (f) second electrode to form an ohmic contact with said second contact layer with respect to said charge.

According to another aspect of the invention, there is provided a photoelectric transducing element comprising (a) a common electrode; (b) a photoconductive layer provided on said common electrode, and composed of an amorphous material containing silicon as a matrix, and hydrogen, or halogen, or both at a ratio of 1 to 30 atomic % with respect to said silicon; (c) a plurality of image element electrodes regularly disposed on said photoconductive layer in confrontation to said common electrode; and (d) contact layers provided between said image element electrodes and said photoconductive layer, said contact layers forming an ohmic contact with said image element electrodes with respect to electric charge in at least one polarity, and being non-continuously formed between mutually adjacent image elements.

BRIEF DESCRIPTION OF DRAWINGS

FIGS. 1 to 4 are schematic diagrams for explaining the first embodiment of the photoelectric transducing element according to the present invention, wherein

DETAILED DESCRIPTION OF PREFERRED EMBODIMENTS

Figure 1:
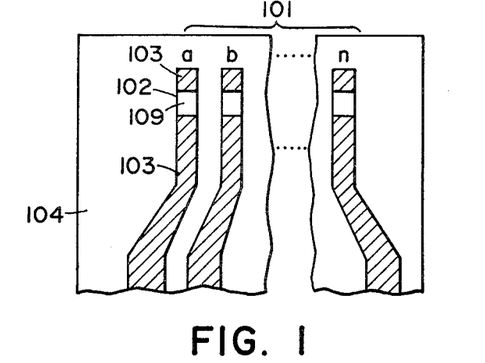
FIG. 1 is a top plan view of the element on its way of fabrication.
Figure 2:
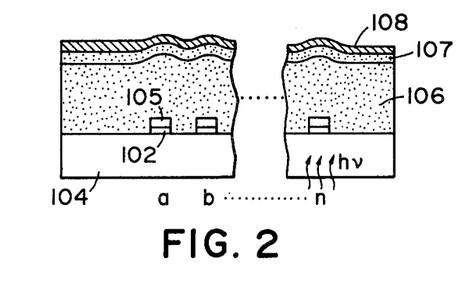
FIG. 2 is a cross-sectional view taken along a line A—A' in FIG. 4.
Figure 3:
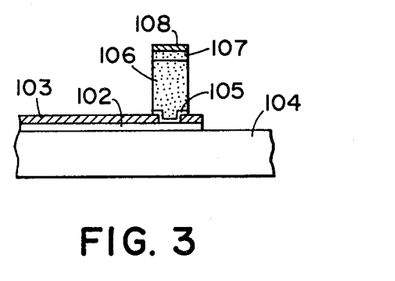
FIG. 3 is also a cross-sectional view taken along a line B—B' in FIG. 4.

Referring first to FIGS. 1 to 4 showing the first embodiment of the photoelectric transducing element according to the present invention, a light transmissive electrode 102 of indium tin oxide (ITO), for example, is formed in an image element pattern 101 on a light transmissive substrate 104. Then, a non-light-transmissive layer 103 is provided on this light transmissive electrode 102, with exception of its light receiving window portion 109, thereby imparting thereto a light intercepting function. Subsequently, a contact layer 105 forming an ohmic contact with the light transmissive electrode 102 is provided on the light receiving window portion (109a, 109b, -, 109n) constituting each image element. Further, a photoconductive layer 106 and another contact layer 107 forming an ohmic contact with a common electrode 108 are provided on the entire surface of the substrate to cover each and every light receiving portion. Finally, the common electrode 108 is formed on the contact layer 107 (vide: FIGS. 1, 2 and 3).

Figure 4:
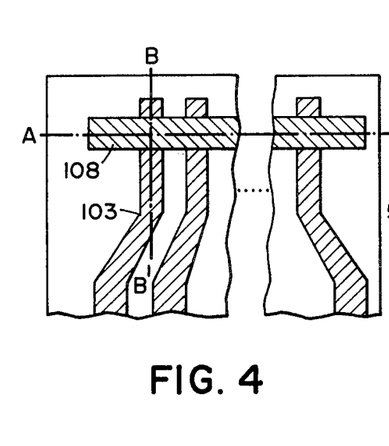
FIG. 4 is also a top plan view of the element as completed.

FIG. 4 is a top plan view of the photoelectric transducing element which has been so fabricated that its cross-sections may be as shown in FIGS. 2 and 3 when they are respectively taken along dash lines A—A' and B—B'. In this embodiment of the photoelectric transducing element according to the present invention, the photoconductive layer 106 is composed of a photoconductive amorphous material consisting of silicon as the matrix and 1 to 30 atomic % of either one or both of hydrogen and halogen. The photoconductive layer constructed with the amorphous material is formed by, for example, the conventionally known plasma CVD (Chemical Vapor Deposition) method, wherein RF or DC glow discharge energy is imparted to a gas consisting principally of $SiH_4$, $Si_2H_6$, $SiF_4$, $SiCl_4$, etc. to decompose the same, and deposit an amorphous layer on a predetermined substrate. Besides this method, there may be adopted the sputtering method and ion-plating method, which are effected in a gaseous atmosphere containing hydrogen or halogen, for the purpose of forming an amorphous layer of the same properties.

The thus fabricated amorphous layer indicative of the photoconductive property has a low level in the forbidden band ($\sim 10^{16}$ $Cm^{-3} \cdot eV^{-1}$), and facilitates controls of its conductivity type by the impurity doping and of its electrical conductivity. In addition, the amorphous layer is superior in its photoconductive property, and has appropriate characteristics as the image original reading material and the photosensor material having characteristics comparable to the relative luminous efficiency in the spectral sensitivity.

The photoconductive layer consisting of the abovementioned amorphous material is sensitive to the discharge power density at the layer formation, the substrate temperature, the gas pressure, and so on. These parameters for the layer formation are controlled very carefully, In the case of using the RF glow discharge method, the electric discharge power density is 1 $W/cm^2$ or below, or preferably 0.1 $W/cm^2$, the substrate temperature ranges from 100° to 350° C., and the gas pressure is constantly controlled in a range of from 0.01 to 1 torr.

The conductivity of the photoconductive layer consisting of the abovementioned amorphous material can be controlled with good reproducibility by use of a mixture gas, in predetermined quantity, for a silicon compound gas or one such as $SiH_4$, $SiF_4$, $SiCl_4$, etc. and $PH_3$ or $AsH_3$ gas for the n-type conductivity, and of the silicon compound gas and $B_2H_6$ gas for the p-type conductivity. Favorable results can also be obtained by doping phosphorus (P) or arsenic (As) as a dopant into the photoconductive layer formed by the ion-implanation method, etc.

As in the embodiment of FIGS. 1 to 4, when both electrode surfaces of the element are disposed perpendicularly to the light incident direction, and the electrode 102 at the side where light enters is made light transmissive, the element can be constructed with the contact layer 105 used as a substitute for the light incidence side electrode and without the electrode 102, provided that the contact layer 105 has a resistance that does not disturb the photo-signal current to a substantial degree. In either case, the total area of the element can be made the light receiving section.

Preferred materials for the light transmissive electrode to form the electrode 102 at the photo-signal input side for the purpose of the present invention are ITO (indium tin oxide), $SnO_2$, and so forth. A semi-transparent metal electrode using Au, Pt, etc. can also be used favorably. The material for the light transmissive substrate 104 is selected from various kinds of transparent glass and resin films.

In order to provide the light receiving windows (109a, 109b, -, 109n) by forming the electrodes (102a, 102b, -, 102n) in the image element patterns 101 and the non-light-transmissive layers (103a, 103b, -, 103n) on the light transmissive substrate 104, a metal layer of Cr, Ti, Pt, etc., for example, is formed by the vacuum deposition on the light transmissive electrode 102 on the overall surface of the light transmissive substrate 104, after which the light receiving windows (109a, 109b, -, 109n) are provided by etching in the image element pattern as shown in FIG. 1. The contact layer 105 to be provided for ohmically contacting the light transmissive electrode 102 and the photoconductive layer 106 is one doped in the n-type conductivity in case of using the electrons in the photo-carriers. This contact layer 105 is effective for the light transmissive electrode 102, when it is highly doped in $n^+$-type, while it is effective for the photoconductive layer 106 when it is slightly doped in $n^-$-type. Accordingly, the doping quantity of the contact layer 105 should preferably range from 50 to 5,000 ppm with respect to the silicon when using the photoconductive layer 106 which has high photo-carrier producing capability and has not been doped, or that which has been slightly doped in either p+ or n-type. The "doping quantity" as referred to herein signifies a ratio of the doping atom to the silicon atom constituting the matrix of the photoconductive layer, which is approximate to a flow rate of the $PH_3$ or $AsH_3$ gas to the raw material gas such as $SiH_4$, $SiF_4$, $SiCl_4$, etc. The electric conductivity of the contact layer 105 according to the present invention ranges from $10^{-6}$ to $10^0$ (ohm-cm)$^{-1}$ or so, the optimum value of which is determined from both the material constituting the light transmissive electrode 102 and the doping quantity in the photoconductive layer 106.

The contact layer 105 is made to a thickness range of from 50 to 1,000 Å in the ordinary case, or optimumly from 100 to 500 Å due to its necessity for permitting incident light on the element to reach the photoconductive layer 106. In practice, it is made to a thickness that can be regarded as substantially transparent to light as the signal to be read. The thus obtained substrate 104, on which the image element pattern 101 having thereon the contact layer 105 has been formed, is returned again to the glow discharge deposition apparatus to form the photoconductive layer 106. For the photoconductive layer 106, there may usually be used an amorphous material consisting of silicon as the matrix and hydrogen or halogen as the constituent (hereinafter simply expressed as "a-Si") which has not been doped with an impurity. However, for increasing the photo-current value, 1.0 to 100 ppm of phosphorus or arsenic may be doped, and, for lowering the dark current, 10 to 100 ppm of boron may be doped. The photoconductive layer 106 has a layer thickness of from 0.3 to 10 microns, or more preferably from 0.5 to 3 microns. The optimum thickness value for the photoconductive layer is determined from facility of its fabrication (such as absence of pin-holes, deposition time, etc.), a degree of expansion of the electric field due to a distance across the adjacent image elements (light receiving windows) and the layer thickness (distance between the image elements/layer thickness > 5/1), and a degree of absorption of incident light (light absorbing factor $\alpha = 10^4$ to $10^5$(cm$^{-1}$): 400 to 700 nm). On the other hand, the photoelectric transducing element according to the present invention is of such a construction that it takes out the secondary current with the least loss, the efficiency G of which is represented by $G = \mu\tau E/l$ (where: $\mu$ is mobility of the carriers (cm/V·sec.); $\tau$ is a life time of the carriers (sec.); E is a field intensity of the photoconductive layer 106 (V/cm); and l is a layer thickness of the photoconductive layer 106 (cm)).

The a-Si layer fabricated under the afore-described conditions and containing therein 1 to 30 atomic % of hydrogen atom, or halogen atom, or both has the value $\mu$ of 0.1 and the value $\tau$ of $10^{-6}$. Accordingly, when $l = 1\mu (= 10^{-4}$ cm), the efficiency G of 10 can be obtained at V = 1 V ($= 10^4$ V/cm), and G = 100 at V = 10 V, provided that the perfect ohmic contact is established. In this way, the efficiency G for taking out the secondary current increases with increase in the applied voltage relative to a constant layer thickness. In the ordinary case, 0.5 to 100 V can be readily used as the applying voltage, so that the layer thickness of the photoconductive layer 106 is selected from a range of 0.3 to 10 microns or so, or preferably 0.5 to 3 microns from the abovementioned standpoint.

The contact layer 107 on the surface of the photoconductive layer 106 opposite to its other surface, through which light enters, is laminated over the entire surface of the photoconductive layer 106 in a continuous manner without breaking the vacuum. The material to be used and the doping quantity for the contact layer 107 are the same as those of the contact layer 105. The optimum value for the doping quantity is selected by the metal material of the electrode to be laminated further on the contact layer 107, the point of which is same as mentioned above. On the other hand, there is no restriction imposed on the thickness of the contact layer 107, since it does not constitute the light receiving surface.

The common electrode 108 is formed on the contact layer 107 by means of the vacuum evaporation method, etc. The common electrode is made of a material selected from various sorts of metal material such as Al, Mo, Au, Ti, and so on.

In the first embodiment of the photoelectric transducing element as shown in FIGS. 1 to 4, it is necessary to provide the contact layers 105, 107 so as to be ohmically contacted with both electrodes 102, 108 and photoconductive layer 106. On account of this, when the contact layer 105, with its resistance having been made small by the impurity doping is used to create electrical isolation between the adjacent image elements, the contact layer 105 is also isolated following the electrode pattern. In this case, the ohmic contact layer is left at the light receiving window portion through the etching process after formation of the contact layer 105 over the entire surface of the electrode 102.

Figure 5:
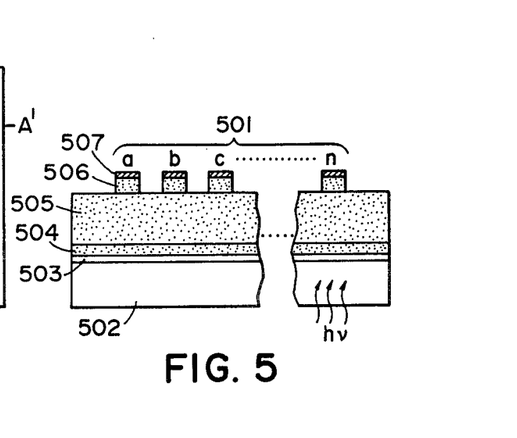
FIG. 5 is a schematic cross-sectional view for explaining the second embodiment of the photoelectric transducing element according to the present invention.

FIG. 5 illustrates the cross-section of the second embodiment of the photoelectric transducing element according to the present invention, wherein the image elements are separated following the pattern of the non-light-transmissive electrodes on the upper part thereof. It is to be noted that the function of each layer is correspondingly the same as that of each layer shown in FIG. 3.

The light transmissive electrode 503 and the contact layer 504 are made common among the image elements, while the non-light-transmissive electrode 507 and the contact layer 506 are isolated by each of the image elements.

The photoelectric transducing elements fabricated in those structures of the first embodiment shown in FIGS. 1 to 4 as well as the second embodiment shown in FIG. 5 are recognized to readily attain the secondary current take-out efficiency G = 10 to 100 (the value being dependent on the applied voltage), and provide such elements that exceed remarkably, under the same light quantity, the photo-current in the photo-diode elements having the same light receiving area.

Figure 6A:
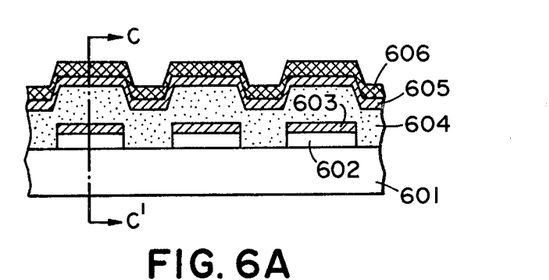
FIG. 6A is a cross-sectional view, in part, of a structure of the third embodiment according to the present invention.
Figure 6B:
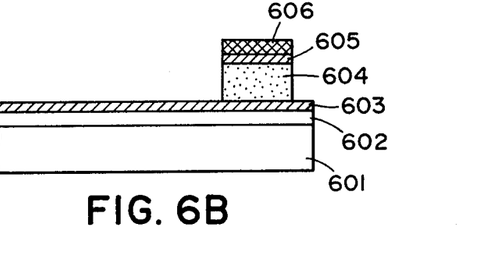
FIG. 6B is a cross-sectional view taken along a line C—C' in FIG. 6A.

FIGS. 6A and 6B illustrate the third embodiment of the photoelectric transducing element according to the present invention, which has a plurality of individual, isolated electrodes 602 made of a light transmissive, electrically conductive material provided on a transparent glass substrate 601, a contact layer 603 of an n-type amorphous silicon (n-a-Si) doped with arsenic or phosphous formed on each of the isolated electrodes 602, a photoconductive layer 604 made of a non-doped amorphous silicon coated over the substrate and the isolated electrodes, another contact layer 605 made of the n-a-Si, and a common electrode 606 made of a non-light-transmissive, electrically conductive material.

In the following, one example of manufacturing the photoelectric transducing element of the above-described construction will be explained.

First of all, the light transmissive, electrically conductive film of $In_2O_3$ is coated on the transparent glass substrate 601 by means of the vacuum deposition method, onto which a chromium film is further coated by the same vacuum deposition method. This chromium film is used as a mask when the light transmissive, electrically conductive film is photo-etched. After removal of the unnecessary portions in the chromium film and the light transmissive, electrically conductive film by the photo-etching, the chromium film is peeled off the light transmissive, electrically conductive film, thereby obtaining the isolated electrodes 602. Then, the contact layer 603 is formed on the substrate with the electrode 602 having been formed thereon by the plasma deposition method using $SiH_4$ and $PH_3$ gases. After this, those unncessary portions of the contact layer 603 are removed, leaving the contact layer 603 on the isolated electrodes alone. Subsequently, the photoconductive layer 604 is formed by the plasma deposition method using $SiH_4$, and the contact layer 605 by the same method using $SiH_4$ and $PH_3$. Thereafter, aluminum is coated by the vacuum deposition method, followed by removal of unnecessary portions by the photo-etching method to thereby form the common electrode 606.

It will be noted from FIGS. 6A and 6B that, in this embodiment, the contact layer 603 is present only on the individual isolated electrodes 602, and not between the adjacent isolated electrodes. Accordingly, the resistance across the adjacent isolated electrodes 602 becomes extremely high in comparison with that between the isolated electrode 602 and the common electrode 606, and there can be observed no increase in the dark current, nor interaction of the photo-current, whereby the photoelectric transducing element having a high SN ratio can be obtained. Incidentally, disconnection of the contact layer 603 between the adjacent isolated electrodes 602 can be done not only by the photo-etching, but also by the groove cutting using a lift-off dicing saw.

Figure 7A:
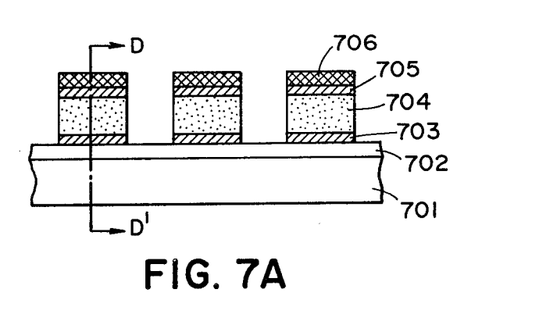
FIG. 7A is a cross-sectional view, in part, of a structure of the fourth embodiment according to the present invention.
Figure 7B:
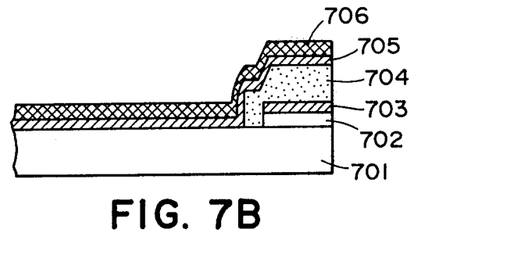
FIG. 7B is a cross-sectional view taken along a line D—D' in FIG. 7A.

FIGS. 7A and 7B illustrate the fourth embodiment of the present invention. Unlike the third embodiment, this fourth embodiment disposes the common electrode 702 beneath the photoconductive layer 704 through the contact layer 703, and the isolated electrodes 706 on the opposite surface of the photoconductive layer 703 through the contact layer 705. According to this electrode arrangement, it is possible to continuously laminate the contact layer 703, the photoconductive layer 704, and the contact layer 705, and thereafter perform the selective etching of the top contact layer 705 alone following the pattern of the isolated electrode. This is a modification of the third embodiment.

In the construction of FIGS. 7A and 7B, the isolated electrodes 706 are rendered mutually disconnected, except for the common electrode portion 702, by sequentially photo-etching the top contact layer 705, the photoconductive layer 704, and the bottom contact layer 703 laminated between these electrodes 706. In this fabrication method, however, the photoconductive layer 704 should be left somewhat larger in width than that of the common electrode 702 in the wiring direction of the isolated electrode 706 so as to prevent the short-circuiting from taking place between the isolated electrode 706 and the common electrode 702. In so doing, any influence of the proximate photoconductive layer onto the isolated electrode 706 can be prevented, whereby the electrical and optical resolutions of the photoelectric transducing element can be further improved.

Figure 8A:
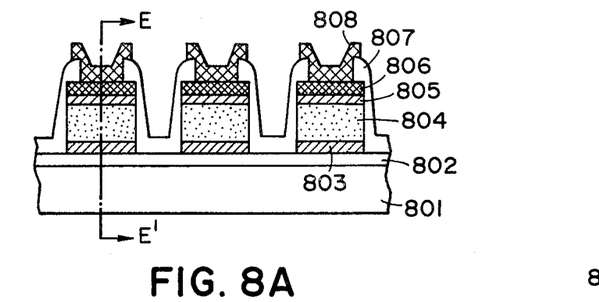
FIG. 8A is a cross-sectional view, in part, of a structure of the fifth embodiment according to the present invention.
Figure 8B:
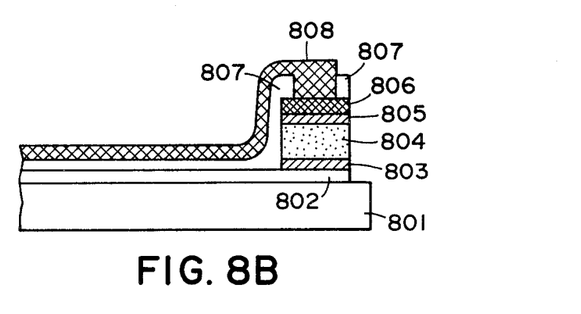
FIG. 8B is a cross-sectional view taken along a line E—E' in FIG. 8A.

FIGS. 8A and 8B illustrate the fifth embodiment of the present invention, wherein the bottom contact layer 803, the photoconductive layer 804, and the top contact layer 805 are continuously laminated on the common electrode 802 made of a light transmissive, electrically conductive material, after which aluminum is coated over the laminated layers to complete the isolated electrodes 806. Subsequently, unnecessary portions of the isolated electrode 806, the contact layer 805, the photoconductive layer 804, and the contact layer 803 are removed by the photo-etching in the order as mentioned. Next, the insulative layer 807 is coated, followed by photo-etching of a portion of the insulative coating 807 to form therein an opening for a wiring on each of the isolated electrodes 806. Then, aluminum is coated on this opening part by the vacuum deposition method to form a wiring electrode 808 so that the isolated electrode 806 and the wiring electrode 808 may be electrically contacted through this opening portion.

According to the embodiment, since it is possible to prevent the electrical short-circuiting between the wiring electrode 808 and the common electrode 802 by the insulative film 807, the method as used in the fourth embodiment becomes unnecessary. Further, use of the non-light-transmissive material makes it possible to prevent influence due to strayed light, which improves the resolution and insures the required insulation. Furthermore, since the contact layer 803, the photoconductive layer 804, and the contact layer 805 can be formed continuously, the interface between each of the contact layers 803, 805 and the photoconductive layer 804 can be kept cleaned. In addition, the SN ratio of the photoelectric transducing element improves with improvement in the ohmic property of the electrical contact between each of the contact layers and the photoconductive layer 804, whereby more reliable photoelectric transducing element can be fabricated.

For the material to constitute the insulative film in this fifth embodiment, there may be suitably used a polyimide resin (e.g., P.I.Q. (polyimide-isoindol-quinazoline-dione)), and $SiO_2$ and $Si_3N_4$ film by the plasma CVD method.

Figures 9A, 9B:
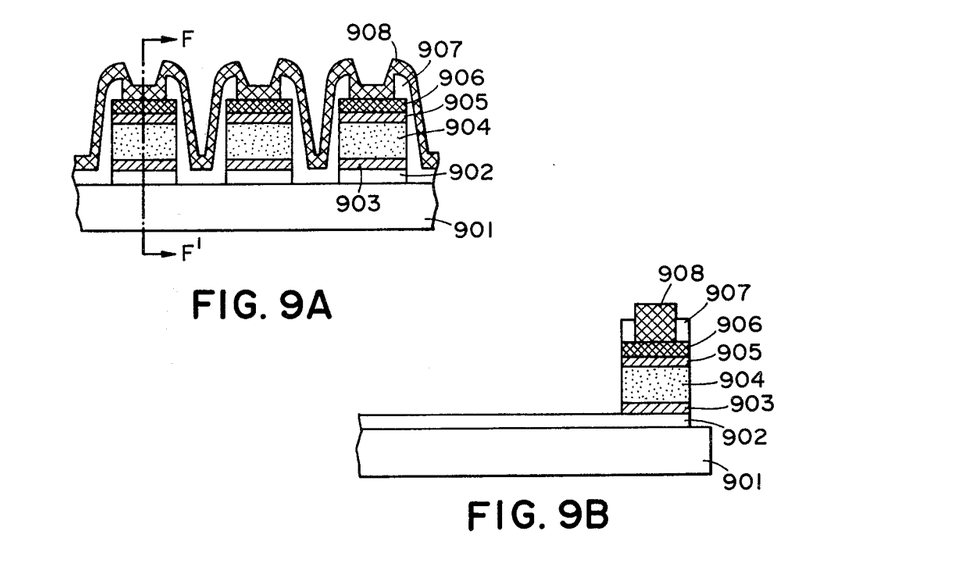
FIG. 9A is a cross-sectional view, in part, of a structure of the sixth embodiment according to the present invention.
FIG. 9B is a cross-sectional view taken along a line F—F' in FIG. 9A.

Further illustrated in FIGS. 9A and 9B are the sixth embodiment of the present invention, wherein the isolated electrodes are disposed on the bottom part, and the common electrode on the top part.

The sixth embodiment exhibits the same degree of improvement in the resolution and the SN ratio as mentioned in the fifth embodiment, whereby the photoelectric transducing element of high reliability can be fabricated. Accordingly, the fifth and sixth embodiments are more excellent examples of the element construction.

In FIGS. 9A and 9B, the isolated electrode 902, the bottom contact layer 903, the photoconductive layer 904, the top contact layer 905, and the electrode 906 to be sequentially formed on the light transmissive substrate 901 have an isolated, independent construction between the adjacent elements (image elements). The insulative film 907 is interposed between the adjacent elements. No insulative film 907 is provided on the portion corresponding to the electrode 906, but the common wiring electrode 908 and the electrode 906 provided on each element are electrically contacted.

As stated in the foregoing, according to the fifth and sixth embodiment of the present invention, it becomes possible to readily obtain the photoelectric transducing element having high SN ratio, excellent resolution, high rate of yield and reliability by electrically and optically separating the adjacent elements in an array of the photoelectric transducing elements having a large area and a long length. As is apparent from the contents of the fifth and sixth embodiments, the material for forming the photoconductive layer is not only limited to a-Si but also Cd-Te, a-Se, a-Se-Te, etc. may equally be used. The photoelectric transducing element according to the present invention can also be used in various other elements having a construction of the photo-transistor, avalanche diode, and so on.

Further, in the fifth and sixth embodiments, explanations have been made as to a case of using the a-Si layer heavily doped with an n-type impurity (n+ layer) as the contact layer. It is to be noted that the equal effect can also be resulted even when the a-Si layer heavily doped with a p-type impurity (p+ layer) is used as the contact layer. Furthermore, in the fifth and sixth embodiments, explanations have also been made as to a case, wherein the bottom electrode (to the side of the substrate) is made of a light transmissive and electrically conductive material, and the top electrode is made of a non-light-transmissive and electrically conductive material. It should, however, be appreciated that the bottom electrode (substrate side) may be made of the non-light-transmissive and electrically conductive material, and the top electrode may be made of the light transmissive material, or both top and bottom electrodes may be made of the light-transmissive and electrically conductive material.

Figure 10A:
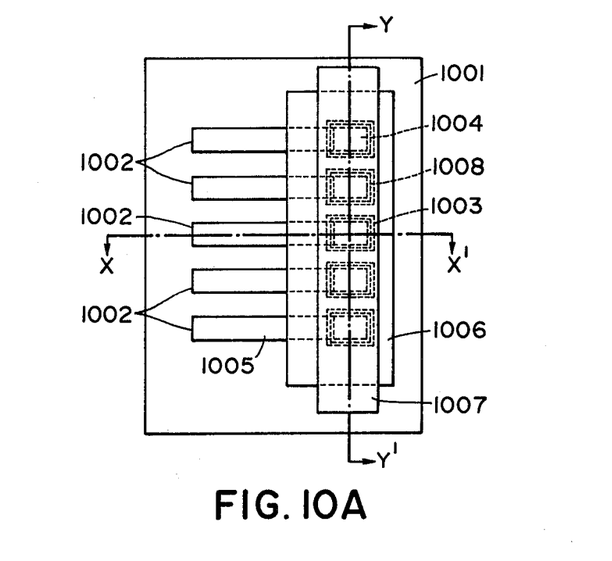
FIG. 10A is a top plan view of the seventh embodiment of the photoelectric transducing element according to the present invention.
Figure 10B:
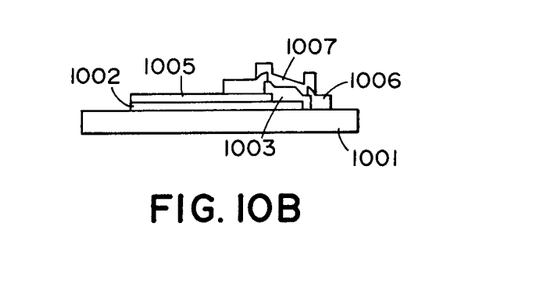
FIG. 10B is a cross-sectional view taken along a line X—X' in FIG. 10A.
Figure 10C:
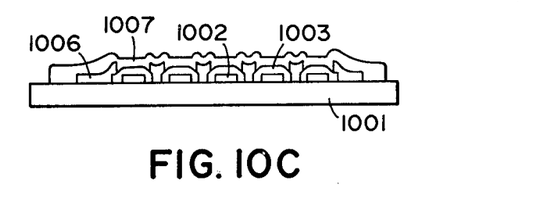
FIG. 10C is a cross-sectional view taken along a line Y—Y' in FIG. 10A.

FIGS. 10A, 10B and 10C illustrate the the seventh embodiment of the present invention.

For the substrate 1001, there may be used a material having the light transmissive property and a high degree of flatness such as, for example, a glass plate available in general market under a tradename of "Corning #7059". Optical fibers, plastic materials may also be used for the purpose. Onto this substrate, a material for the transparent electrodes 1002 is evaporatively deposited, after which the coated material is subjected to pattern-etching to form the individually isolated electrodes 1002. Indium tin oxide (ITO) is used as the material for the transparent electrodes 1002. Besides this, there may be used also various light transmissive electrode materials such as thin oxide (a product of Pittsburgh Plate Glass Co. sold under a tradename of "NESA"), thin metal films, etc. A light intercepting film 1005 is evaporatively deposited on the transparent electrodes 1002, after which a portion corresponding to the light receiving section 1004 is removed by etching. The photoconductive layer 1003 is formed by depositing a-Si by the glow discharge method, for example. With a view to realizing an ohmic contact between the transparent electrodes 1002 and the common electrode 1007, the contact layer is provided between the photoconductive layer 1003 and each of transparent electrodes 1002. For the material to constitute the photoconductive layer 1003, there may be exemplified CdSe, Se-As-Te, etc., besides the abovementioned a-Si. The thus formed photoconductive layer 1003 is in an insular form on each of the transparent electrodes 1002.

The insulative film 1006 is formed by, for example, spinner coating of PIQ, in which a through-hole 1008 is perforated by the pattern-etching to take a contact between the common electrode 1007 and the photoconductive layer 1003. Both transparent electrode 1002 and the through-hole 1008 are in the same shape with the exception of its lead-out direction. For the formation of the insulative film 1006, there may also be used a deposited film of $SiO_2$, $S_3N_4$, etc. Subsequently, aluminum is evaporatively deposited on the insulative film 1006 to enable the common electrode 1007 to be formed thereon, after which the deposited aluminum coating is subjected to a predetermined pattern-etching into the common electrode, whereby the desired photoelectric transducing element is completed.

In this photoelectric transducing element, each of the light receiving sections 1004 is independently disposed on each of the transparent electrodes 1002, on account of which the dark current flows to the electrode portion alone confronting to each light receiving section. The photo-current signal is not at all affected by the adjacent light receiving sections.

Figure 11:
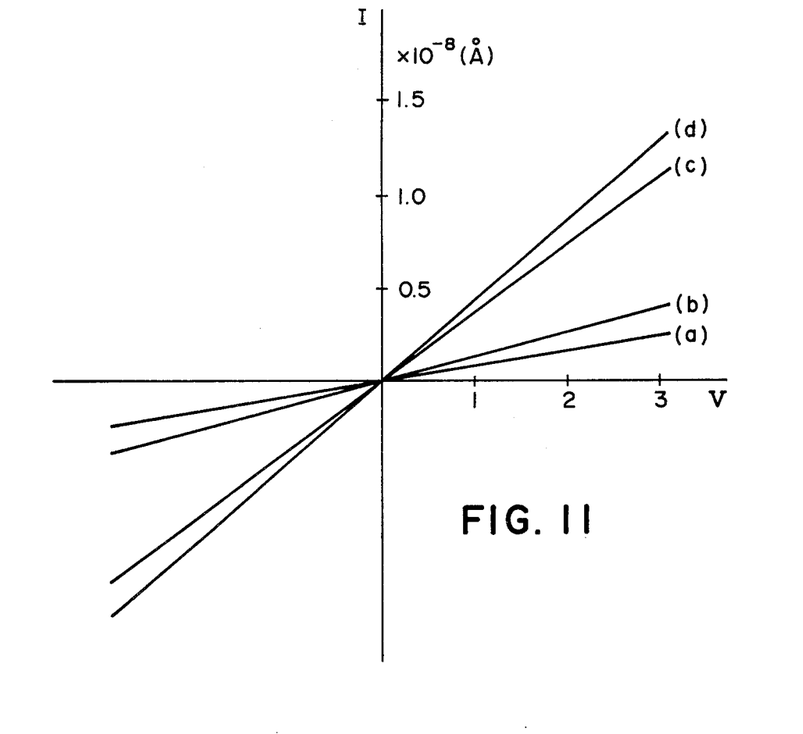
FIG. 11 is a graphical representation showing comparison between the photoelectric transducing element according to the present invention and a conventional element.

FIG. 11 indicates the results of comparison between the conventional photoelectric transducing element and that of the present invention, wherein in order to find out the dark current and the resolution in one light receiving section, one of the two light receiving sections is applied with a bright light image, while the other with a dark light image, and a photo-current in the light receiving section with the dark light image applied thereto is measured for each element. In the drawing, the lines a and b denote the dark current, and the lines c and d the photo-current.

As indicated by the line (b), the dark current in the conventional photoelectric transducing element is large, while it is small in the seventh embodiment of the present invention as indicated by the line (a). Further, as indicated by the line (d), the photo-current at the time of irradiating a dark light image (with small light quantity) is large in the conventional element, and it is small in the seventh embodiment of the present invention as indicated by the line (c), from which it is found out that influence of the bright light image (with much light quantity) to be irradiated onto the adjacent elements has been improved.

Further, it has been recognized that the element which utilizes PIQ as the material for the insulative film 1006 is effective to the moisture-resistant property.

Figure 12A:
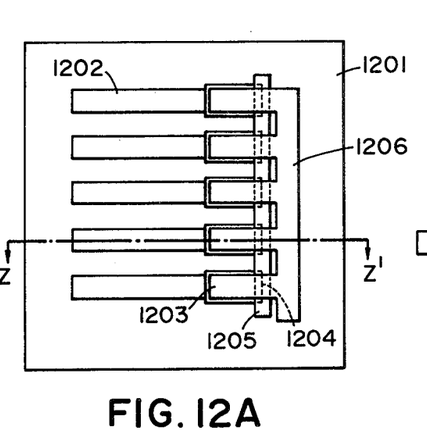
FIG. 12A is a top plan view of the ninth embodiment of the photoelectric transducing element according to the present invention.
Figure 12B:
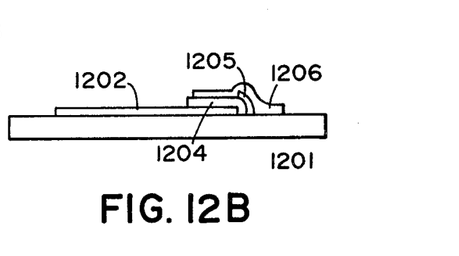
FIG. 12B is a cross-sectional view taken along a line Z—Z' in FIG. 12A.

FIGS. 12A and 12B indicate the eight embodiment of the present invention, in which the light transmissive electrodes 1202 are provided on the light transmissive substrate 1201, and the photoconductive layer 1204 is provided in an independent form on the portion corresponding to each light receiving section 1203 of the light transmissive electrode 1202. Further, the thin and long insulative film 1205 is provided in a manner to cover the end portion of each of the photoconductive layers 1204. The common electrode 1206 is provided in a manner to cover both photoconductive layer 1204 and the insulative film 1205.

What we claim is:

1. A photoelectric transducing element comprising:
   (a) a substrate;
   (b) first electrode provided on said substrate;
   (c) first contact layer to form an ohmic contact with said first electrode with respect to electric charge in at least one polarity;
   (d) a photoconductive layer provided in contact with said first contact layer and composed of an amorphous material containing silicon as a matrix and at least one member selected from the group of hydrogen and halogen at a ratio of 1 to 30 atomic % with respect to said silicon;
(e) second contact layer provided in contact with said photoconductive layer; and
(f) second electrode to form an ohmic contact with said second contact layer with respect to said charge.

2. The photoelectric transducing element according to claim 1, wherein said first contact layer is composed of an amorphous material containing silicon as a matrix; at least one member selected from the group of hydrogen and halogen at a ratio of 1 to 30 atomic %; and at least one member selected from the group of phosphorous (P) and arsenic (As) as an impurity.

3. The photoelectric transducing element according to claim 1, wherein said second contact layer is composed of an amorphous material consisting of silicon as a matrix; at least one member selected from the group of hydrogen and halogen at a ratio of 1 to 30 atomic %; and at least one member selected from the group of phosphorous (P) and arsenic (As) as an impurity.

4. The photoelectric transducing element according to claim 2, wherein the content of said impurity ranges from 100 to 5,000 ppm with respect to said silicon.

5. The photoelectric transducing element according to claim 3, wherein the content of said impurity ranges from 100 to 5,000 ppm with respect to said silicon.

6. The photoelectric transducing element according to claim 1, wherein one of said contact layers constitutes a layer at a side of the element where light information is received, said one layer having a thickness of 500 angstroms.

7. The photoelectric transducing element according to claim 1, wherein one of said first and second electrodes includes a plurality of image element electrodes which are isolated to define image elements.

8. The photoelectric transducing element according to claim 7, wherein the contact layer associated with said image element electrodes is electrically disconnected at least between mutually adjacent image element electrodes.

9. The photoelectric transducing element according to claim 7, wherein an insulative film is interposed between said image element electrodes.

10. A photoelectric transducer comprising:
(a) a common electrode;
(b) a plurality of image element electrodes disposed in confrontation to said common electrode;
(c) a photoconductive layer provided between said common and image electrodes, and composed of an amorphous material containing silicon as a matrix, and at least one member selected from the group of hydrogen and halogen at a ratio 1 to 30 atomic % with respect to said silicon; and
(d) a contact layer provided between said image element electrodes and said photoconductive layer said contact layer forming an ohmic contact with said image element electrodes with respect to electric charge in at least one polarity, and being non-continuously formed between mutually adjacent image elements.

11. The photoelectric transducer according to claim 10, wherein said contact layer is composed of an amorphous material containing silicon as a matrix; at least one member selected from the group of hydrogen and halogen at a ratio of 1 to 30 atomic %; and at least one member selected from the group of phosphorus and arsenic as an impurity.

12. The photoelectric transducer according to claim 11, wherein the content of said impurity ranges from 100 to 5,000 ppm with respect to said silicon.

13. The photoelectric transducing element according to claim 1 or 10, wherein a region other than the light receiving section is covered with an insulative coating.

14. A photoelectric transducing element comprising:
(a) a photoconductive layer composed of an amorphous material containing silicon as a matrix, and at least one member selected from the group of hydrogen and halogen at a ratio of 1 to 30 atomic % with respect to said silicon;
(b) first and second contact layers, each being provided independently of the other in contact with said photoconductive layer;
(c) first electrode in contact with said first contact layer and forming an ohmic contact with said layer with respect to electric charge in at least one polarity;
(d) second electrode in contact with said second contact layer and forming an ohmic contact with said layer with respect to said electric charge in at least one polarity; and
(e) a substrate for holding thereon said contact layers and electrodes.

15. The photoelectric transducing element according to claim 14, wherein said first and second contact layers are composed of an amorphous material containing silicon as a matrix; at least one member selected from the group of hydrogen and halogen at a ratio of 1 to 30 atomic %; and at least one member selected from the group of phosphorous (P) and arsenic (As) as an impurity.

16. The photoelectric transducing element according to claim 15, wherein content of said impurity ranges from 100 to 5,000 ppm with respect to said silicon.

17. The photoelectric transducing element according to claim 14, wherein one of said contact layers constitutes a layer at a side where light information is received, said one layer having a thickness of 500 angstroms.

18. The photoelectric transducing element according to claim 14, wherein one of said first and second electrodes includes a plurality of image element electrodes which are isolated to define image elements.

19. The photoelectric transducing element according to claim 18, wherein the contact layer associated with said image element electrodes is electrically disconnected at least between mutually adjacent image element electrodes.

20. The photoelectroc transducing element according to claim 18, wherein an insulative film is interposed between the adjacent image element electrodes.

21. The photoelectric transducing element according to claim 1, wherein said first contact layer is composed of an amorphous material containing silicon as a matrix; at least one member selected from the group of hydrogen and halogen; and at least one member selected from the group of phosphorous (P) and arsenic (As) as an impurity.

22. The photoelectric transducing element according to claim 1, wherein said second contact layer is composed of an amorphous material consisting of silicon as a matrix; at least one member selected from the hydrogen and halogen; and at least one member selected from the group of phosphorous (P) and arsenic (As) as an impurity.

23. The photoelectric transducing element according to claim 1, wherein one of said contact layers constitutes a layer at a side where light information is received.

24. The photoelectric transducing element according to claim 14, wherein said first and second contact layers are composed of an amorphous material containing silicon as a matrix; at least one member selected from the group of hydrogen and halogen; and at least one member selected from the group of phosphorous (P) and arsenic (As) as an impurity.

25. The photoelectric transducing element according to claim 14, wherein one of said contact layers constitutes a layer at a side where light information is received.

26. A photoelectric transducer comprising:
(a) a light transmissive substrate;
(b) a light transmissive electrode provided on said substrate;
(c) a light transmissive contact layer to form an ohmic contact with said light transmissive electrode with respect to electric charge in at least one polarity;
(d) a photoconductive layer provided in contact with said light transmissive contact layer and comprising an amorphous material containing silicon as a matrix and at least one member selected from the group of hydrogen and halogen;
(e) second contact layer provided in contact with said photoconductive layer;
(f) a second electrode to form an ohmic contact with said second contact layer with respect to said charge;
(g) non-light transmissive layer provided in contact with said light transmissive electrode except where light is to be received.

27. The photoelectric transducer according to claim 26, wherein said first contact layer comprises an amorphous material containing silicon as a matrix; at least one member selected from the group of hydrogen and halogen; and at least one member selected from the group of phosphorous (P) and arsenic (As), as an impurity.

28. The photoelectric transducer according to claim 26, wherein said second contact layer comprises an amorphous material consisting of silicon as a matrix; at least one member selected from the group of hydrogen and halogen; and at least one member selected from the group of phosphorous (P) and arsenic (As) as an impurity.

29. The photoelectric transducer according to claim 27, wherein the content of said impurity ranges from 100 to 5,000 ppm with respect to said silicon.

30. The photoelectric transducing element according to claim 28, wherein the content of said impurity ranges from 100 to 5,000 ppm with respect to said silicon.

31. The photoelectric transducer according to claim 26, wherein one of said contact layers constitutes a layer at a side where light information is received.

32. The photoelectric transducer according to claim 26, wherein one of said first and second electrodes includes a plurality of image element electrodes which are isolated to define image elements.

33. The photoelectric transducing element according to claim 32, wherein the contact layer associated with said image element electrodes is electrically disconnected at least between mutually adjacent image element electrodes.

* * * * *